United States Patent
Ohno et al.

(10) Patent No.: US 8,310,867 B2
(45) Date of Patent: Nov. 13, 2012

(54) NONVOLATILE SOLID STATE MAGNETIC MEMORY AND RECORDING METHOD THEREOF

(75) Inventors: Hideo Ohno, Sendai (JP); Fumihiro Matsukura, Sendai (JP); Daichi Chiba, Sendai (JP)

(73) Assignees: Japan Science and Technology Agency, Kawaguchi-shi (JP); Tohoku University, Sendai-shi (JP)

( * ) Notice: Subject to any disclaimer, the term of this patent is extended or adjusted under 35 U.S.C. 154(b) by 273 days.

(21) Appl. No.: 12/682,044

(22) PCT Filed: Oct. 3, 2008

(86) PCT No.: PCT/JP2008/068044
§ 371 (c)(1), (2), (4) Date: Apr. 8, 2010

(87) PCT Pub. No.: WO2009/048025
PCT Pub. Date: Apr. 16, 2009

(65) Prior Publication Data
US 2010/0246252 A1  Sep. 30, 2010

(30) Foreign Application Priority Data
Oct. 11, 2007  (JP) ................. 2007-265747

(51) Int. Cl.
*G11C 11/14* (2006.01)
*G11C 11/15* (2006.01)
*G11C 11/00* (2006.01)
(52) U.S. Cl. .......... 365/171; 365/158; 365/173
(58) Field of Classification Search .......... 365/171
See application file for complete search history.

(56) References Cited

U.S. PATENT DOCUMENTS

| | | | | |
|---|---|---|---|---|
| 5,416,353 A | * | 5/1995 | Kamiguchi et al. | 257/421 |
| 6,178,112 B1 | * | 1/2001 | Bessho et al. | 365/173 |
| 6,665,236 B1 | * | 12/2003 | Munekata et al. | 369/13.38 |
| 7,394,685 B2 | * | 7/2008 | Ooishi et al. | 365/171 |
| 7,864,564 B2 | * | 1/2011 | Hidaka | 365/158 |
| 2003/0012050 A1 | | 1/2003 | Iwasaki | |
| 2004/0085827 A1 | * | 5/2004 | Ohno et al. | 365/200 |
| 2005/0012129 A1 | | 1/2005 | Saito | |
| 2006/0017080 A1 | | 1/2006 | Tanaka et al. | |
| 2006/0133137 A1 | | 6/2006 | Shin et al. | |

FOREIGN PATENT DOCUMENTS

JP   2003 007980   1/2003
(Continued)

OTHER PUBLICATIONS

Chiba, D. et al., "Magnetization Vector Manipulation by Electric Fields", NATURE, vol. 455, pp. 515-518 (Sep. 25, 2008).

*Primary Examiner* — Son Mai
(74) *Attorney, Agent, or Firm* — Oblon, Spivak, McClelland, Maier & Neustadt, L.L.P.

(57) ABSTRACT

A nonvolatile solid state magnetic memory with a ultra-low power consumption and a recording method thereof, the memory including a magnetic material having a magnetic anisotropy that can be changed by increasing or decreasing a carrier concentration, wherein a direction of an easy axis of magnetization, in which the magnetization is oriented easily, is controlled by increasing or decreasing the carrier concentration. The nonvolatile solid state magnetic memory including a recording layer of a magnetic material, and a recording method thereof, in which a carrier (electron or hole) concentration in the recording layer is increased and/or decreased, whereby the magnetization is rotated or reversed and the recording operation is performed.

11 Claims, 3 Drawing Sheets

FOREIGN PATENT DOCUMENTS

| JP | 2003 197920 | 7/2003 |
| JP | 2004 055866 | 2/2004 |
| JP | 2004 023563 | 3/2004 |
| JP | 2005 011907 | 1/2005 |
| JP | 2006 179891 | 7/2006 |
| JP | 2006 286713 | 10/2006 |

* cited by examiner

US 8,310,867 B2

NONVOLATILE SOLID STATE MAGNETIC MEMORY AND RECORDING METHOD THEREOF

TECHNICAL FIELD

The present invention relates to a nonvolatile solid state magnetic memory and a recording method thereof.

BACKGROUND ART

A magnetization direction in a ferromagnetic material has conventionally been utilized as an information bit for a magnetic recording medium. In the nonvolatile magnetic memory (MRAM: Magnetoresistive Random Access Memory), for example, a bit "0" or "1" is determined depending on whether the magnetization directions in a top and bottom layer of a tunnel magnetoresistive element, in which a tunnel barrier layer is sandwiched by the top and bottom layers which are magnetic thin film layers called a free layer and a pinned layer, are parallel or anti-parallel. A word line and a bit line are wired above and below a single magnetic bit (hereinafter called a cell), and the magnetization direction in the free layer can be reversed by making use of a synthetic magnetic field which is generated by applying a current to the word and bit lines.

Since the magnetic field required for the magnetization reversal increases as the ferromagnetic material is miniaturized, a larger current becomes necessary for realizing the magnetization reversal when the size of the cell becomes smaller. Therefore, this technique has a limitation when a large scale integration is taken into consideration.

As a technique to overcome this difficulty, there exists a method to reverse the magnetization by spin injection. This is a technique to reverse the magnetization in the free layer directly by injecting a spin polarized current from the pinned layer. Since the current density required for the magnetization reversal is not significantly influenced by the cell element area, the smaller the cell element, the less current is required for the magnetization reversal. This means that the power consumption needed for writing to a bit could be decreased. The required current density in the state of the art is, however, about $10^7$ A/cm$^2$. Further reduction of the current density is a technical issue toward the low power consumption required for large scale integration.

However, another technical issue will have to be taken into account in the future, that is, when the writing current becomes too low, an output voltage for reading out in turn becomes difficult to obtain, since the current necessary for reading out information must always be lower than the current for writing the information.

The nonvolatile magnetic memory based on the magnetization reversal realized by a magnetic field generated by a current has already been commercially available (see Non-Patent Document 1 below). On the other hand, the memory based on the magnetization reversal realized by spin injection is now at the experimental stage (see Non-Patent Document 2 below).

Non-Patent Document 1: http://www.freescale.com/
Non-Patent Document 2: Digest of technical papers of 2007 IEEE
International Solid-State Circuits Conference (ISSCC 2007), pp. 480-481, February 2007.

DISCLOSURE OF THE INVENTION

The feature of the present invention lies in making use of a magnetic material in which the magnetic anisotropy is changed by increasing or decreasing a carrier concentration, and lies in controlling a direction of an easy axis of magnetization (a direction in which the magnetization is oriented easily) by increasing or decreasing the carrier concentration, thereby enabling rotating and/or reversing the magnetization without using a magnetic field. Furthermore, applying an electric field is used as means for increasing or decreasing the carrier concentration, which enables writing to a bit with a power consumption significantly less than that of the conventional magnetization reversal methods. Thus, the present invention provides a nonvolatile solid state magnetic memory with ultra-low power consumption.

In view of the situations described above, the object of the present invention is to provide a nonvolatile solid state magnetic memory with a ultra-low power consumption and a recording method thereof, the memory comprising a magnetic material having a magnetic anisotropy that can be changed by increasing or decreasing a carrier concentration, wherein a direction of an easy axis of magnetization (a direction in which the magnetization is oriented easily) is controlled by increasing or decreasing the carrier concentration.

To fulfill the object described above, the present invention provides;

[1] A recording method of a nonvolatile solid state magnetic memory, the memory comprising a recording layer of a magnetic material, comprising the step of increasing and/or decreasing a carrier (electron or hole) concentration in the recording layer, whereby the magnetization is rotated or reversed, and the recording operation is performed.

[2] The method according to above [1], wherein a carrier induced ferromagnetic material is used as the recording layer.

[3] The method according to above [1], wherein the nonvolatile solid state magnetic memory is configured to have a capacitance structure by comprising a predetermined substrate which supports the recording layer, and a metallic electrode layer which is provided on the recording layer via an electrically insulating layer.

[4] The method according to above [3], wherein the recording layer and the metallic electrode layer function as accumulation layers of electric charges with opposite signs, and wherein the step is performed by applying a voltage across the recording layer and the metallic electrode layer.

[5] The method according to above [1], wherein the nonvolatile solid state magnetic memory is configured to have a field effect transistor structure by comprising a predetermined substrate which supports the recording layer, and a metallic electrode layer which is provided on the recording layer via an electrically insulating layer, the recording layer acting as a channel layer and the metallic electrode layer acting as a gate electrode, and wherein the step is performed by applying a voltage across the recording layer and the metallic electrode layer.

[6] The method according to above [2], wherein the recording layer is a carrier induced ferromagnetic semiconductor.

[7] The method according to above [6], wherein the recording layer is a carrier induced ferromagnetic semiconductor layer which is a group IV semiconductor, a group III-V semiconductor, a group II-VI semiconductor, a group II-VI-V$_2$ semiconductor, or an oxide semiconductor doped with transition metal element or rare earth metal element.

[8] The method according to above [7], wherein the electrically insulating layer is a Schottky barrier formed between the metallic electrode layer and the recording layer of the carrier induced ferromagnetic semiconductor.

[9] The method according to any one of above [1] to [8], wherein a buffer layer is provided between the substrate and the recording layer.

[10] The method according to above [1], wherein the recording layer has a composite structure of different magnetic materials, or a composite structure of a magnetic material and a non-magnetic material.

[11] The method according to above [6], wherein the step is performed by light illumination.

[12] A nonvolatile solid state magnetic memory, comprising:
(a) a substrate;
(b) a recording layer of a magnetic material which is formed on the substrate and has an easy axis of magnetization in the plane of the layer;
(c) an electrically insulating layer formed on the recording layer; and
(d) a metallic electrode layer formed on the insulating layer,
wherein the memory is configured to have a field effect transistor structure in which the recording layer acts as a channel layer and the metallic electrode layer acts as a gate electrode, and which is provided with means for applying a voltage across the recording layer and the metallic electrode layer.

[13] The memory according to above [12], wherein the recording layer is a carrier induced ferromagnetic material layer.

[14] The memory according to above [12], wherein the recording layer is a (Ga,Mn)As layer.

[15] The memory according to above [12], wherein the recording layer is a carrier induced ferromagnetic semiconductor layer which is a group IV semiconductor, a group III-V semiconductor, a group II-VI semiconductor, a group II-VI-$V_2$ semiconductor, or an oxide semiconductor doped with transition metal element or rare earth metal element.

[16] The memory according above [14], wherein the electrically insulating layer is a Schottky barrier formed between the metallic electrode layer and the recording layer of the carrier induced ferromagnetic semiconductor.

[17] The memory according to above [12], wherein a buffer layer is provided between the substrate and the recording layer.

[18] The memory according to above [12], wherein the recording layer has a composite structure of different magnetic materials or a composite structure of a magnetic material and a non-magnetic material.

BEST MODE FOR CARRYING OUT THE INVENTION

A recording method of a nonvolatile solid state magnetic memory, the memory comprising a recording layer of a magnetic material in accordance with the present invention, comprising the step of increasing and/or decreasing a carrier (electron or hole) concentration in the recording layer, whereby the magnetization is rotated or reversed, and the recording operation is performed.

Embodiments

Hereinafter, preferred embodiments of the present invention will be described in detail.

First of all, the principles of the present invention will be explained.

The magnetization direction of the ferromagnetic material has been used as an information bit of the magnetic recording medium. In the nonvolatile magnetic memory (MRAM), a bit "0" or "1" is determined depending on whether the magnetization directions in a top and bottom layer of a tunnel magnetoresistive element, in which a tunnel barrier layer is sandwiched by the top and bottom layers which are magnetic thin film layers called a free layer and a pinned layer, are parallel or anti-parallel. Writing to a bit can be performed by reversing the magnetization in one of the layers by the magnetic field generated by a current. However, when the size of the ferromagnetic bit is the order of sub-micron, a spin current that is another technique for the magnetization reversal by means of a spin transfer torque becomes more favorable as long as power consumption is concerned. However, a current density as high as $10^{6-8}$ A/cm$^2$ is still required at present for this technique.

By making use of the fact that the magnetic anisotropy of a carrier induced ferromagnetic material is a function of the carrier concentration, the present inventors have investigated various conditions under which the magnetization direction can be controlled by modulating the carrier concentration by means of a gate electric field E. Magnetic properties of a hole induced ferromagnetic material of (Ga,Mn)As have been studied in detail, and it has been found that this material exhibits a complicated magnetic anisotropy. It has also been found that hole concentration p and the Curie temperature $T_c$ can be controlled by the gate electric field E. It has been furthermore observed that the magnetization direction can be changed by light illumination.

Taking for example the magnetic anisotropy in a (Ga,Mn)As layer which is disposed on a substrate and has an easy axis of magnetization in the plane of the layer, the present inventors have simulated the magnetization direction control (rotation and reversal) with an ultra-low power consumption, which does not need an external magnetic field or a spin current, by using a coherent magnetization rotation model.

Figure 1:
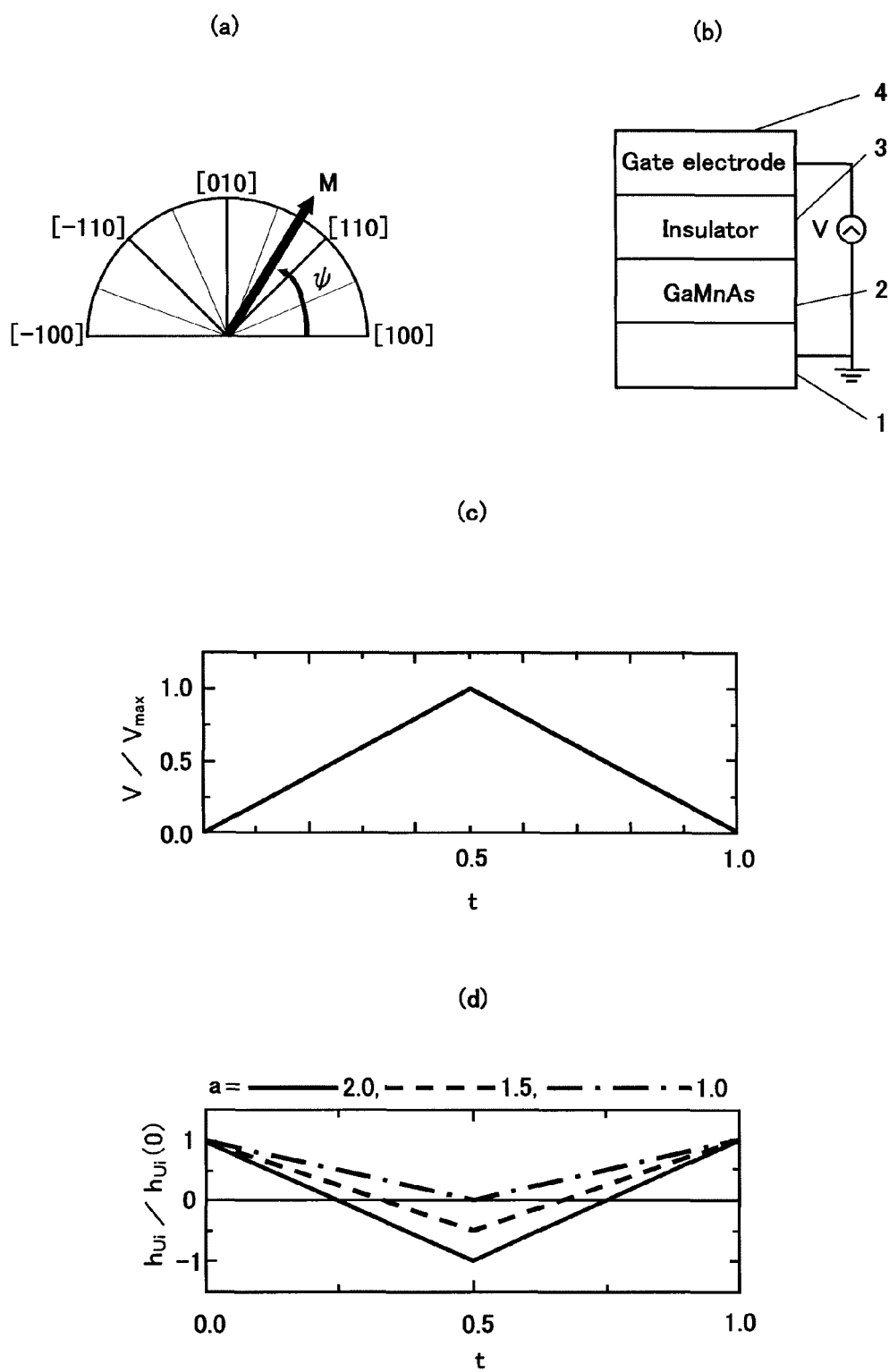
FIG. 1 shows properties of magnetic anisotropy of (Ga,Mn)As which has an easy axis of magnetization in the plane of the film in accordance with an embodiment of the present invention.

FIG. 1 shows properties of the magnetic anisotropic of a (Ga,Mn)As film which has an easy axis of easy magnetization present in the plane of the film in accordance with the present invention. FIG. 1 (a) shows a relationship between a magnetization angle and a crystallographic axis. FIG. 1 (b) is a schematic view showing a device structure. FIG. 1 (c) shows a time dependence of an applied input voltage, and FIG. 1 (d) shows a time dependence of the change of the magnetic anisotropy induced by the applied voltage.

FIG. 1 (b) shows a substrate 1, a (Ga,Mn)As layer 2 acting as a recording layer on the substrate 1, an insulating layer 3 on the (Ga,Mn)As layer 2, and a gate electrode layer 4 on the insulating layer 3. In FIG. 1 (d), a solid line, a dashed line and a dot-dashed line correspond to a parameter "a" for the cases of a=2.0, a=1.5 and a=1.0, respectively. Since it is difficult to deposit the recording layer 2 directly on the substrate 1, in general, the magnetic property of the recording layer 2 is optimized beforehand. For example, a GaAs or (In,Ga)As layer which is well commensurate both with the substrate 1 and the recording layer 2 is formed on the substrate 1 as a buffer layer, and the recording layer 2 is formed on the buffer layer. Similarly, when the recording layer 2 is another ferromagnetic semiconductor such as a group IV semiconductor, a group III-V semiconductor, a group II-VI semiconductor, a group II-VI-$V_2$ semiconductor, or an oxide semiconductor doped with transition metal element or rare earth metal element, an appropriate buffer layer which is well commensurate with the substrate 1 and the recording layer 2 can be used.

It is well known that the (Ga,Mn)As layer 2 is under compression strain, and that it has a biaxial cubic magnetic anisotropy (B) along the [100] and [010] directions in the plane of the layer on the substrate 1, an uniaxial magnetic anisotropy (UI) along the [100] or [010] direction, and an uniaxial magnetic anisotropy (U2) along the [110] or [−110] direction. The biaxial cubic magnetic anisotropy (B) is considered to be a magnetic anisotropy resulting from the valence band structure of the (Ga,Mn)As layer 2. The anisotropic magnetic field due to the uniaxial magnetic anisotropy (UI) is very weak, and difficult to be detected unless a high sensitivity measurement is performed. Furthermore, its origin is not clear yet. The uniaxial magnetic anisotropy (U2) is reported to change its sign depending on the hole concentration p and the Mn composition, the sign discriminating the easy axis of magnetization between the [110] and [−110] directions.

The magnetic energy F of the system when an external magnetic field is equal to zero is given by the equation (1) below.

$$F = \frac{MH_B}{2}\left[\frac{1}{4}\sin^2 2\phi + \left(\frac{H_{u1}}{H_B}\right)\sin^2\phi + \left(\frac{H_{u2}}{H_B}\right)\sin^2\left(\phi - \frac{\pi}{4}\right)\right] \quad (1)$$

Here, M is a spontaneous magnetization, $\psi$ is an angle of the magnetization from the [100] direction, while $H_B$, $H_{U1}$ and $H_{U2}$ are magnetic anisotropy magnetic fields due to the biaxial cubic magnetic anisotropy (B), the uniaxial magnetic anisotropy (UI) and the uniaxial magnetic anisotropy (U2), respectively. The spontaneous magnetization M is oriented at angle $\psi$ which satisfies $\partial F/\partial\psi=0$, $\partial^2 F/\partial\psi^2>0$ as shown in FIG. 1 (a). For the typical (Ga,Mn)As layer 2, an inequality $H_B>H_{U2}>>H_{U1}$ is satisfied at a temperature sufficiently below the Curie temperature $T_c$, and when temperature increases and approaches the Curie temperature $T_c$, $H_B$ decreases significantly, and in some cases an inequality $H_B<H_{U2}$ is satisfied. In the (Ga,Mn)As field effect device such as shown in FIG. 1 (b), the hole concentration p can be controlled by applying the gate electric field E, so that it can be expected that not only the magnitude but also the sign of $H_B$, $H_{U1}$, and $H_{U2}$ can be controlled.

By applying the gate voltage V, which is equal to Ed, wherein d is a thickness of the gate insulating layer, into the device, each of $H_B$, $H_{U1}$, and $H_{U2}$ becomes a function of V.

For simplicity, it is assumed here that $H_{U1}/H_B(=h_{U1})$ and $H_{U2}/H_B(=h_{U2})$ change in proportion to V, and that the input voltage V(t) ($0\leq t\leq 1$) (t is a dimensionless number) has a triangle wave as shown in FIG. 1 (c).

$$h_{Ui}(V(t)) = h_{Ui}(0)\left[1 - a\frac{V(t)}{V_{max}}\right] (i = 1, 2) \quad (2)$$

Here, "a" is a coefficient representing a degree of modulation of $h_{U1}$ and $h_{U2}$ resulting from applying the gate voltage V, and when a>1, the anisotropic magnetic field has a duration in which the sign of the anisotropic magnetic field is temporarily changed due to the input voltage as shown in FIG. 1 (d). $V_{max}$ is a maximum value of the applied gate voltage V. Since the local minimum value in the $\psi$ dependence of the magnetic energy F changes with time by applying V(t), the spontaneous magnetization M is rotated or reversed.

Figure 2:
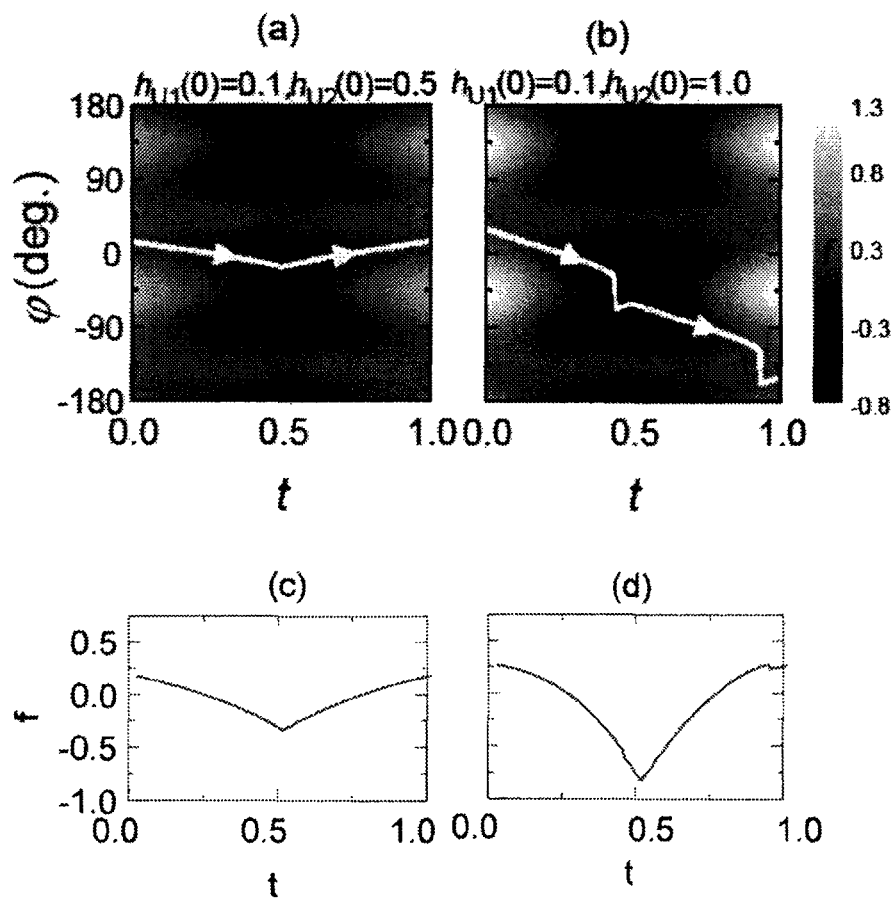
FIG. 2 shows time dependences of an angle of the magnetization, a normalized magnetic energy, and a local minimum value of the normalized magnetic energy in each condition in accordance with an embodiment of the present invention.

FIG. 2 shows time dependences of an angle of the magnetization, the normalized magnetic energy, and a local minimum value of the normalized magnetic energy under various conditions in accordance with the present invention. FIG. 2(a) and FIG. 2(b) show a time evolution of an angle $\psi$ of the magnetization from the direction [100], and a time evolution of an angle is dependence of the magnetization from the direction [100] with normalized magnetic energy $f=2F/MH_B$ for the case of a=2. FIG. 2 (c) and FIG. 2(d) show time dependences of the local minimum value ($=f_{rain}$) of the normalized magnetic energy f. For the case of $h_{U1}(0)=0.1$, and $h_{U2}(0)=0.5$, the spontaneous magnetization M is rotated by applying V(t) but returns to the original angle at t=1. For the case of $h_{U1}(0)=0.1$ and $h_{U2}(0)=1.0$, the spontaneous magnetization M rotates clockwise and is oriented at 180 degrees from the original angel at t=1, thus a reversal is realized. In this case, the minimum value $f_{min}(t)$ of the normalized magnetic energy is not symmetric with respect to t=0.5, and discontinuous rotation of the spontaneous magnetization M occurs two times. In order to study the reversal condition, a difference $\Delta\psi$ between the angle $\psi$ from the [100] direction before applying V(t) and that of after applying V(t) was calculated with respect to $h_{U1}(0)$ and $h_{U2}(0)$.

Figure 3:
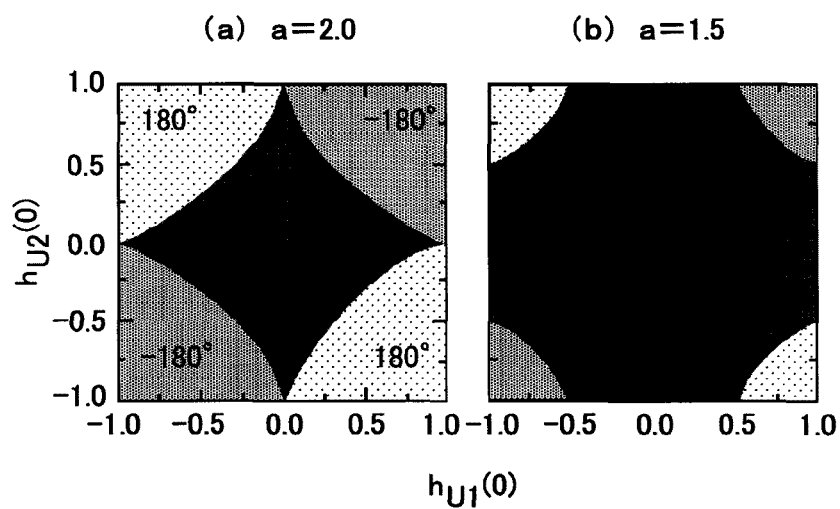
FIG. 3 shows maps of a rotation angle of magnetization for a value of a coefficient "a" representing a degree of modulation of $h_{U1}$ and $h_{U2}$ resulting from each applied gate voltage V in accordance with an embodiment of the present invention.

FIG. 3 shows maps illustrating a rotation angle of magnetization for a value of a coefficient "a" representing a degree of modulation of $h_{U1}$ and $h_{U2}$ resulting from each applied gate voltage V in accordance with the present invention.

FIG. 3 (a) shows a simulation result in the case of a=2. It is shown that the reversal condition is given by an asteroid curve as shown in equation (3).

$$h_{U1}^{\frac{2}{3}}(0) + h_{U2}^{\frac{2}{3}}(0) \geq r \quad (3)$$

Here, "r" is a constant relating to a magnitude of the asteroid curve, and the intersection of the ordinate axis and the abscissa axis in the asteroid curve is equal to $r^{3/2}$ in FIG. 3. For the case of a=2, r=1. Furthermore, when the reversal happens and the product of $h_{U1}(0)$ and $h_{U2}(0)$ is positive (or negative), the spontaneous magnetization M is reversed after a clockwise rotation (or counterclockwise rotation). For the case of a=1.5, "r" becomes larger as shown in FIG. 3 (b).

Figure 4:
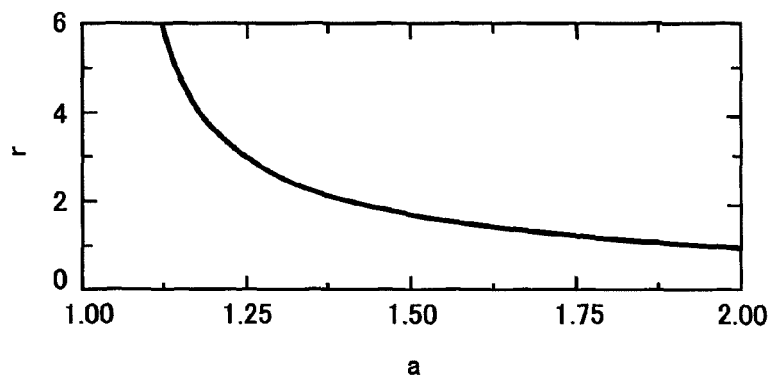
FIG. 4 shows a dependence of "r" on a coefficient "a" representing a degree of modulation of $h_{U1}$ and $h_{U2}$ resulting from an applied gate voltage of V of "r" in accordance with an embodiment of the present invention.

FIG. 4 shows a dependence of "r" on the coefficient "a" representing a degree of modulation of $h_{U1}$ and $h_{U2}$ resulting from an applied gate voltage V of "r" in accordance with the present invention.

This figure shows that "r" diverges when "a" approaches to 1, and the rotation happens but no reversal happens when a $\leq$ 1. In order to hold the information without volatility after writing, i.e. to maintain the magnetization direction in the reversed state even after the input voltage is switched off, it is inevitable in a practical application to induce the reversal.

In summary, the reversal conditions are that signs of two uniaxial magnetic anisotropy can be changed by applying the gate electric field E when a>1, and that $h_{U1}(0)$ and $h_{U2}(0)$ lie outside of the asteroid curve defined by the above equation (3). For (Ga,Mn)As, $h_{U2}(0)$ becomes nearly equal to 1 at a temperature relatively close to the Curie temperature $T_c$. Furthermore, it is reported that $h_{U1}(0)$ is approximately 0.01 at a temperature much lower than $T_c$, though. Therefore, the magnetization reversal can be expected if "a" can be increased up to 2. Similar effects can be expected when the recording layer is made of another carrier induced ferromagnetic material with similar magnetic anisotropy such as (In,Mn)As.

In the MRAM (SPRAM) using a spin transfer torque, current is required to generate a spin current, which causes power consumption. Current is not required in the MRAM in accordance with the present invention which utilizes the electric field induced magnetization reversal, so that power consumption is extremely small. However, an extrinsic power consumption which is not consumed for the magnetization reversal, i.e. displacement current due to charging and discharging of electric charges and steady leak current in the insulating film may occur. When power consumption required for the magnetization reversal is compared on a basis that an area per bit, and a magnitude and time duration of an applied voltage are same for each bit using these two techniques, the power consumption of the technique according to the present invention is estimated to be one millionth or less than that of the SPRAM described in Non-Patent Document 2. For the device in accordance with the present invention, power consumption of a series resistance which is as large as the sheet resistance due to the displacement current and the power due to electrostatic energy are two main contributors to the power consumption.

Figure 5:
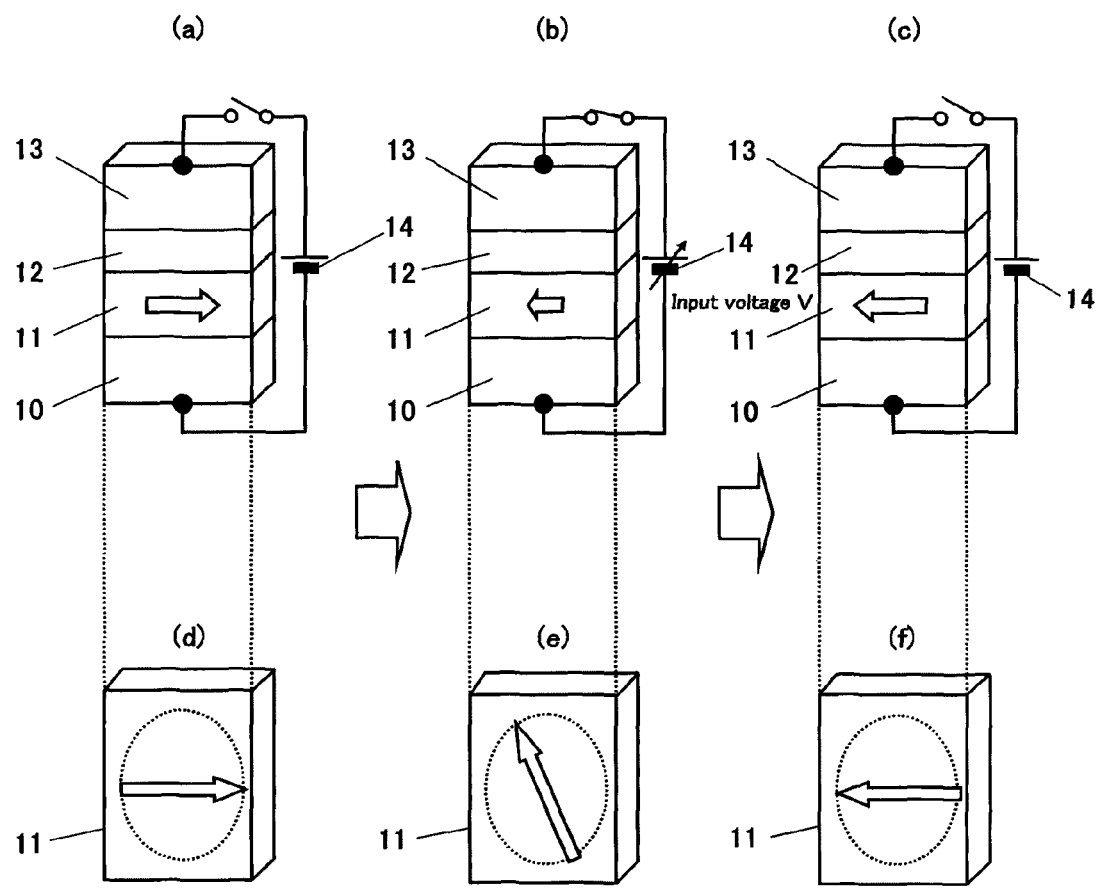
FIG. 5 shows an example of a device structure in accordance with an embodiment of the present invention.

FIG. 5 shows an example of a device structure in accordance with the present invention. FIG. 5(a) to FIG. 5(c) show the device structures and FIG. 5(d) to FIG. 5(f) show respective top views of the magnetic material layer. Arrows in the magnetic material layers represent the magnetization directions.

As shown in FIG. 5, a magnetic material layer 11 (recording layer) is provided, which includes a metallic electrode layer 13, an insulating layer 12, and a substrate 10. This structure is directed to increase or decrease a carrier (electron or hole) concentration in the magnetic material layer 11, by applying the voltage from a voltage source 14 across the metallic electrode layer 13 and the magnetic material layer 11. Other structures which fulfill this purpose may also be used. For example, if the magnetic material layer 11 is a magnetic semiconductor, the insulating layer 12 can be replaced by a Schottky barrier. Also, when the magnetic semiconductor is used, light illumination can excite (i.e. increase, or decrease in some cases) carriers. In this case, the metallic electrode layer 13 and the insulating layer 12 are not necessary.

As the magnetic material layer 11, a layer which changes its direction of the easy axis of magnetization (magnetic anisotropy) by increasing or decreasing the carrier concentration is used. A composite structure of a magnetic material body and a non-magnetic material body or a composite structure of different kinds of magnetic materials can also be used as the magnetic material layer 11. For example, if the magnetic material layer 11 is replaced by a composite structure such magnetic material 11/insulator/magnetic material body 11, it is only necessary that the carrier concentration of at least one of the magnetic materials can be increased or decreased.

Further description will be given on a typical device shown in FIG. 5, which enables increase or decrease of the carrier concentration by applying the electric field. It is assumed here that the metallic electrode layer 13, the insulating layer 12, and the magnetic material layer 11 are stacked in layers, and the easy axis of magnetization in the magnetic material layer 11 is oriented in a direction in the plane of the magnetic material as shown in FIG. 5(a). Then, the voltage is applied across the metallic electrode layer 13 and the magnetic material body layer 11, which causes increase or decrease of the carrier concentration, thereby changing the easy axis of magnetization and rotating the magnetization such as shown in FIG. 5(b). In a case where the magnetic material layer 11 has a complicated magnetic anisotropy, it is possible not only to rotate but also reverse the magnetization only by increasing or decreasing the carrier concentration. In particular, this is the case where the magnetic material layer 11 has two uniaxial easy axes of magnetization ($U_1$ and $U_2$) in two different directions, and biaxial easy axes of magnetization (B). The uniaxial magnetic anisotropy is an anisotropy wherein a direction in which the magnetization is oriented easily (an easy axis) and a direction in which the magnetization is hard to be oriented (a hard axis) appear with a period of 180-degree. The biaxial anisotropy is an anisotropy wherein the easy axis and the hard axis appear with a period of 90-degree.

When the easy axis and the hard axis are exchanged, the sign of the anisotropic magnetic field is conveniently taken to be negative. When magnitudes of these anisotropic magnetic fields are shown as $H_{U1}$, $H_{U2}$, $H_B$, respectively, the magnetization is reversed under the condition that the ratio $H_{U1}/H_B = h_{U1}$ and the ratio $H_{U2}/H_B = h_{U2}$ can be controlled by applying the voltage and that the applied voltage sequence which causes the signs of $h_{U1}$ and $h_{U2}$ to be reversed and then returned is given. Typical example of the applied voltage sequence includes a voltage pulse with triangular wave, a sinusoidal wave, or a dull rectangular wave.

The present invention is not limited to the embodiments described above. Various modifications are possible in accordance with the spirit of the present invention. These modifications should not to be excluded from the scope of the present invention.

Following advantages are obtained according to the present invention.

In the magnetization reversal method by applying an electric field in accordance with the present invention, power consumption required for the magnetization reversal is estimated to be one millionth or less than that of the magnetization reversal method using a magnetic field or the magnetization reversal method using a spin current, thereby enabling to realize a recording method of a nonvolatile solid state magnetic memory with ultra-low power consumption.

Industrial Applicability

The nonvolatile solid state magnetic memory and the recording method thereof in accordance with the present invention can be used for a nonvolatile solid state magnetic memory and a recording method thereof in which rotation and reversal of the magnetization is feasible without using a magnetic field.

The invention claimed is:

1. A recording method of a nonvolatile solid state magnetic memory, the memory comprising:
   a substrate;
   a recording layer formed on the substrate, the recording layer being a carrier induced ferromagnetic semiconductor layer made of a group IV semiconductor, a group III-V semiconductor, a group II-VI semiconductor, a group II-VI-$V_2$ semiconductor, or an oxide semiconductor doped with transition metal element or rare earth metal element;
   an electrically insulating layer formed on the recording layer; and
   a metallic electrode layer formed on the insulating layer,
   wherein the insulating layer is a Schottky barrier formed by a junction between the metallic electrode layer and the recording layer, the method comprising the steps of:

applying a voltage across the recording layer and the metallic electrode layer; and increasing and/or decreasing a carrier (electron or hole) concentration in the recording layer and thereby controlling a direction of an easy axis of magnetization of the recording layer to control the magnetization direction of the recording layer.

2. The method according to claim 1, wherein the recording layer and the metallic electrode layer function as accumulation layers of electric charges with opposite signs.

3. The method according to claim 1, wherein the recording layer acts as a channel layer and the metallic electrode layer acts as a gate electrode.

4. The method according to claim 1, wherein a buffer layer is provided between the substrate and the recording layer.

5. The method according to claim 1, wherein the recording layer has a composite structure of different magnetic materials, or a composite structure of a magnetic material and a non-magnetic material.

6. The method according to claim 1, wherein the step is performed by light illumination.

7. A nonvolatile solid state magnetic memory, comprising:

a substrate;

a recording layer formed on the substrate, the recording layer having an easy axis of magnetization in the plane of the layer, and being a carrier induced ferromagnetic semiconductor layer made of a group IV semiconductor, a group III-V semiconductor, a group II-VI semiconductor, a group II-VI-V$_2$ semiconductor, or an oxide semiconductor doped with transition metal element or rare earth metal element;

an electrically insulating layer formed on the recording layer; and a metallic electrode layer formed on the insulating layer; and means for applying a voltage across the recording layer and the metallic electrode layer, wherein the electrically insulating layer is a Schottky barrier formed by a junction between the metallic electrode layer and the recording layer, wherein the memory is configured to have a field effect transistor structure in which the recording layer acts as a channel layer and the metallic electrode layer acts as a gate electrode.

8. The memory according to claim 7, wherein a buffer layer is provided between the substrate and the recording layer.

9. The memory according to claim 7, wherein the recording layer has a composite structure of different magnetic materials or a composite structure of a magnetic material and a non-magnetic material.

10. The method according to claim 2, wherein a buffer layer is provided between the substrate and the recording layer.

11. The method according to claim 3, wherein a buffer layer is provided between the substrate and the recording layer.

* * * * *